United States Patent [19]

Tsuchiya

[11] Patent Number: 4,734,384
[45] Date of Patent: Mar. 29, 1988

[54] PROCESS FOR MANUFACTURING SEMICONDUCTOR MEMORY DEVICE

[75] Inventor: Osamu Tsuchiya, Ohme, Japan
[73] Assignee: Hitachi, Ltd., Tokyo, Japan
[21] Appl. No.: 862,638
[22] Filed: May 13, 1986
[30] Foreign Application Priority Data
May 13, 1985 [JP] Japan .................................. 60-99575
[51] Int. Cl.$^4$ ...................... H01L 21/76; H01L 21/82
[52] U.S. Cl. ........................................ 437/52; 437/38; 437/60; 437/160; 437/203
[58] Field of Search ..................... 29/580, 576 W, 571; 357/23.6, 49, 51; 156/644, 651, 652, 653

[56] References Cited

U.S. PATENT DOCUMENTS

| 4,333,794 | 6/1982 | Beyer et al. | 156/653 |
|---|---|---|---|
| 4,381,953 | 5/1983 | Ho et al. | 148/115 |
| 4,385,975 | 5/1983 | Chu et al. | 156/652 |
| 4,569,701 | 2/1986 | Oh | 29/571 |
| 4,582,565 | 4/1986 | Kawakatsa | 148/187 |
| 4,593,459 | 6/1986 | Poppert et al. | 29/571 |

FOREIGN PATENT DOCUMENTS

| 0177066 | 9/1986 | European Pat. Off. | 357/23.6 |
|---|---|---|---|
| 61-5572 | 1/1986 | Japan | 357/23.6 |

OTHER PUBLICATIONS

*IEDM*, 1985, pp. 710–713, "Buried Storage Electrode Cell for Magabit Drams", by M. Sakamoto et al.
*IEDM*, 1984, pp. 240–243, "An Isolation-Merged Vertical Capacitor Cell for Large Capacity Dram", by S. Nakajima et al.
*IBM Technical Disclosure Bulletin*, vol. 27, No. 11, Apr. 1985, pp. 6694–6697, "Dynamic RAM Cell with Merged Drain and Storage".
"CMOS Dynamic Random-Access Memory Cell", IBM TDB, vol. 28, No. 6, Nov. 1985, pp. 2578–2579.

Primary Examiner—Brian E. Hearn
Assistant Examiner—Tom Thomas
Attorney, Agent, or Firm—Antonelli, Terry & Wands

[57] ABSTRACT

A dynamic RAM having a memory cell constituted by a capacitor element, utilizing a trench or moat formed in a semiconductor substrate, and a MISFET. One of the electrodes of the capacitor element is connected to the MISFET constituting part of the memory cell at the side wall of the upper end of the moat for forming the capacitor element. This electrode is connected in self alignment with a semiconductor region which serves as either the source or drain of the MISFET.

22 Claims, 13 Drawing Figures

PROCESS FOR MANUFACTURING SEMICONDUCTOR MEMORY DEVICE

BACKGROUND OF THE INVENTION

This invention relates to a semiconductor memory device and, more particularly, to a technique effectively applied to a semiconductor memory having a memory cell constituted by a series circuit of a capacitor element and a MISFET. A memory cell of a dynamic random access memory (DRAM) is constituted by a series circuit of a MISFET (Metal Insulator Semiconductor Field Effect Transistor) and a capacitor element. To increase the degree of integration of DRAMs, techniques for reducing the area which is occupied by the capacitor element, without decreasing the capacitance value thereof, have heretofore been studied. Examples of such techniques include one in which a surface portion of a semiconductor substrate near a MISFET is etched in the depthwise direction to form a trench or moat, and a capacitor element is formed using this moat. In such a case, a first electrically conductive layer for providing the capacitor element may be connected to one of the semiconductor regions of the MISFET. In this case, a contact hole for connecting the first electrically conductive layer and this semiconductor region needs to be formed in the upper surface of the semiconductor region, and this increases the area required for the memory cell.

To overcome the above-described problem, one technique has already been mentioned in "Nikkei Electronics", Jan. 14, 1985, pp. 122-123, published by *Nikkei McGraw-Hill,* in which a moat is formed around a MISFET provided in a semiconductor substrate, and a contact hole is formed in a predetermined portion of the inner wall of this moat, and the electrically conductive layer of the capacitor element is connected with one of the semiconductor regions of the MISFET through the contact hole. This technique is also described in the *Technical Digest* of the 1984 International Electron Devices Meeting, pp. 240-243.

SUMMARY OF THE INVENTION

I have found as a result of examination of this technique that, to form a capacitor element by providing a moat around a MISFET, the impurity concentration in a relatively deep portion of the semiconductor substrate must be higher than that in the surface portion thereof. To realize this, it is necessary to form an epitaxial layer having a relatively low impurity concentration on the semiconductor substrate having a relatively high impurity concentration, which increases the number of required manufacturing steps.

The reason that the impurity concentration in a relatively deep portion of the substrate must be higher than that in a surface portion is given in the following. When a moat is formed around a MISFET, the electrically conductive layer of the capacitor element is consequently provided around the MISFET. When this electrically conductive layer is brought to a high level, an inversion layer may be produced in a portion of the semiconductor substrate around the capacitor element. In such a case, even when the MISFET is in a turned-off state, an electrical charge which represents information undesirably flows out to a data line through the inversion layer. For this reason, in order to prevent the formation of such inversion layer, it is necessary to increase the impurity concentration in the semiconductor substrate. On the other hand, when the impurity concentration in the channel portion of the MISFET is relatively high, the MISFET may become unable to operate. Therefore, the impurity concentration in a shallow portion of the semiconductor substrate must be relatively low. In other words, it is necessary that a shallow portion of the semiconductor substrate should have a relatively low impurity concentration, whereas a portion of the substrate which has a depth of 3 $\mu$m or more should have a relatively high impurity concentration. A semiconductor substrate having such an impurity concentration distribution can be realized only by the epitaxial technique It is an object of the present invention to provide a technique which enables a reduction in the area occupied by a memory cell, as well as the memory cell formed thereby.

It is another object of the present invention to provide a technique which permits an improvement in the information holding characteristics of a memory cell and which enables a reduction in the number of required manufacturing steps.

It is still another object of the present invention to provide a memory cell so as to avoid problems arising due to the capacitor element of the memory cell surrounding the MISFET of the memory cell.

It is still another object of the present invention to provide a technique which enables connection between an electrically conductive layer provided in a moat and one semiconductor region of a MISFET at the side wall surface of the moat, as well as the memory cell formed thereby.

The above and other objects, novel features and advantages of the present invention will become clear from the following description taken in conjunction with the accompanying drawings.

A brief summary of the representative of the novel techniques disclosed by this application is as follows. However, the present invention is not to be limited thereto.

Namely, one of the electrodes of a capacitor element which constitutes part of a memory cell is connected to a MISFET which constitutes another part of the memory cell at the side wall of the upper end of a moat provided for forming the capacitor element. The electrode is connected in self alignment with a semiconductor region which serves as the source or drain of the MISFET. The moat is formed so as to be adjacent the associated MISFET, rather than surrounding such MISFET. It is possible, by virtue of this arrangement, to reduce the area required for the memory cell.

DESCRIPTION OF THE PREFERRED EMBODIMENTS

Figure 1:
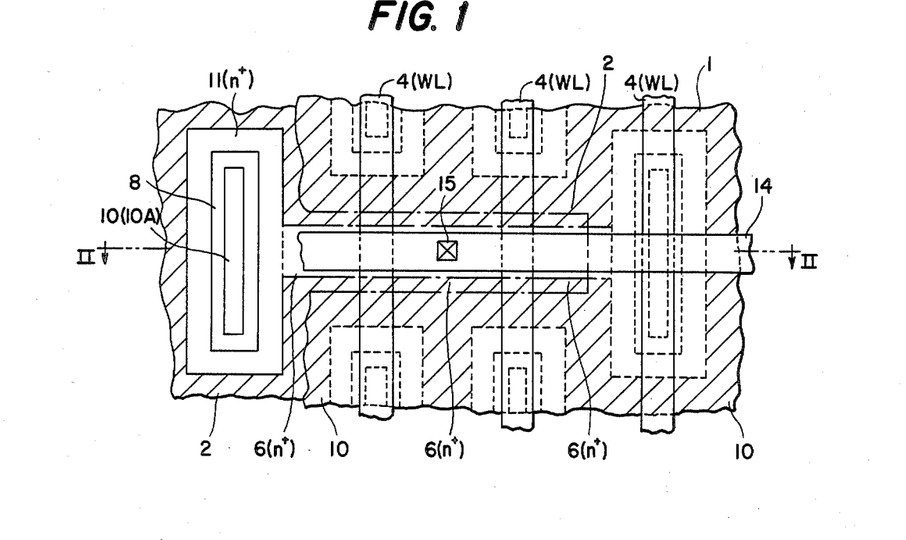
FIG. 1 is a plan view of a memory cell of a DRAM in accordance with one embodiment of the present invention.
Figure 2:
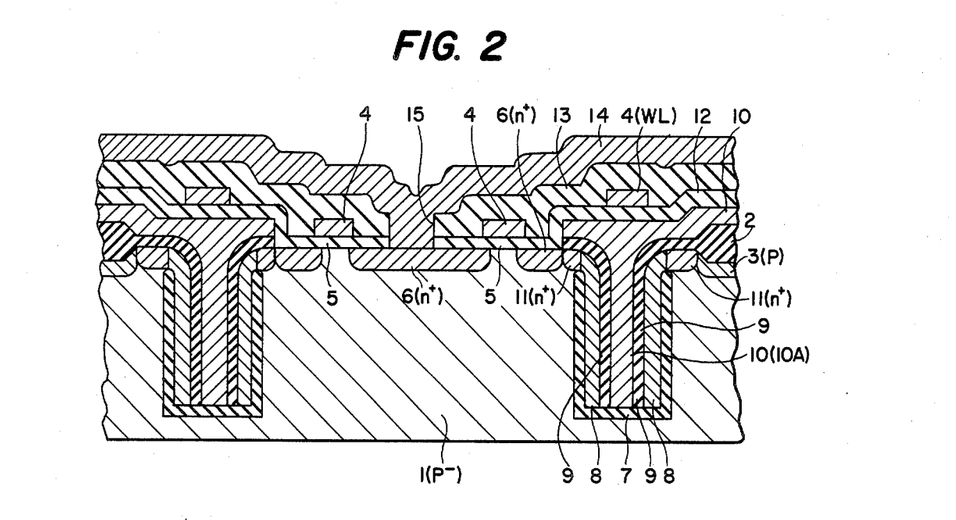
FIG. 2 is a sectional view taken along the line II—II in FIG. 1.

Referring first to FIGS. 1 and 2, which show in combination the arrangement of a memory cell of a DRAM in accordance with one embodiment of the present invention, FIG. 1 is a plan view of the memory cell, and FIG. 2 is a sectional view taken along the line II—II in FIG. 1. It is to be noted that no insulating film provided between electrically conductive layers is shown in FIG. 1, for the purpose of facilitating understanding of the arrangement of the memory cell. Throughout the drawings provided for describing embodiments of the present invention, portions or members having the same functions are denoted by the same reference numerals, and any repetitive description thereof is omitted.

In FIGS. 1 and 2, the reference numeral 1 denotes a semiconductor substrate constituted by a p⁻ type single crystal silicon. In order to electrically isolate memory cells from each other, a field insulating film 2 and a p+ type channel stopper region 3 are provided on the substrate 1 so as to surround a memory cell, as is done conventionally.

The numeral 4 denotes gate electrodes, each of which constitutes a MISFET together with a gate insulating film 5 and n+ type semiconductor regions 6. The gate electrode 4 is also employed as a word line (WL).

A capacitor element in accordance with this embodiment is composed of: an insulating film 7 provided on the inner wall of a moat (no reference numeral is given) which extends in the depthwise direction from the main surface of the semiconductor substrate 1 near the corresponding MISFET; an electrically conductive layer 8 provided on the insulating film 7 on the side wall of the moat; an insulating film 9 provided so as to cover the surface portion of the conductive layer 8; and an electrically conductive layer 10 buried in the center of the moat. As shown in FIG. 2, no insulating film 7 is provided along the entire periphery of the side wall surface of the upper end portion of the moat. This is to electrically connect the conductive layer 8 and one of the semiconductor regions 6 of the MISFET at the upper end portion of the moat. Connecting the conductive layer 8 to the semiconductor region 6 in this way enables elimination of the need to provide a contact hole which would otherwise be needed in the upper surface of the semiconductor region 6 in order to connect the layer 8 to the region 6.

In this embodiment, an n+ type semiconductor region 11 is provided between the conductive layer 8 and the semiconductor region 6 so that the conductive layer 8 and semiconductor region 6 are connected together through this region 11. The semiconductor region 11 is formed by introducing an impurity within the conductive layer 8 into the semiconductor substrate 1 through the junction between the layer 8 and the substrate 1. The conductive layer 8 is, as shown in FIG. 2, not provided on the bottom of the moat, but the layer 8 is annularly provided in the moat as shown in FIG. 1. An electrically conductive layer 10A serves as an electrode buried in the moat and is electrically integral with the conductive layer 10 provided in the upper part of the moat. A voltage (½ $V_{CC}$) which is about half a power source voltage $V_{cc}$ as applied to the conductive layer 10 (10A). This enables the thickness of the insulating film 9 to be reduced, and the capacitance can be consequently increased.

The reference numerals 12 and 13 denote insulating films. A data line 14 is connected to the semiconductor region 6 through a contact hole 15.

As will be understood from the above description, it is possible, according to this embodiment, to eliminate the need to provide a contact hole which would otherwise be needed to the upper surface of the semiconductor region 6 in order to connect the conductive layer 8 and the region 6, so that it is possible to reduce the area on the semiconductor substrate 1 which is occupied by the memory cell.

When the conductive layer 8 is connected to the semiconductor region 6 through a contact hole (window) provided to the upper surface of the region 6, the conductive layer 8 provided above the semiconductor region 6 and the gate electrode 4 and conductive layer 8 must be spaced apart from each other at a distance larger than a possible mask alignment error. However, in accordance with this embodiment, it is possible to eliminate the need to provide any mask alignment margin between the conductive layer 8 and the gate electrode 4, so that the area which the memory cell occupies on the semiconductor substrate 1 can be further reduced.

As will be clear from FIG. 1, in accordance with this embodiment the conductive layer 8 of the capacitor element is provided so as not to intersect the gate electrode 4. This arrangement eliminates leakage of electric charges, which phenomenon might occur when the moat and the capacitor electrode are provided around the MISFET. It is therefore possible to increase the information holding time of the memory cell by the present invention.

Moreover, where the capacitor element intersects the gate electrode 4, the semiconductor substrate 1 needs to have a relatively high impurity concentration to prevent the above-described leakage of electric charges. When the impurity concentration of the substrate 1 becomes higher, the parasitic capacitance at the junction between the substrate 1 and the semiconductor region 6 increases. Since it is unnecessary, according to this embodiment of the present invention, to increase the impurity concentration of the semiconductor substrate 1, the parasitic capacitance of the semiconductor region 6 can be reduced. It is therefore possible, by the present invention, to increase the speed of operation in writing and reading information into and from the DRAM.

It is to be noted that the insulating films 5, 7, 9, 12 and 13 are not shown in FIG. 1. In addition, in FIG. 1, the conductive layers 10 and 14 are partially omitted, and one word line 4 is also omitted, in order to show the structure of one capacitor element.

The following is a description of a practical method of manufacturing a memory cell of a DRAM in accordance with this embodiment.

FIGS. 3 to 10 are views used to explain various steps carried out when manufacturing the memory cell of the DRAM shown in FIGS. 1 and 2, which figures correspond to FIG. 2 and show the memory cell in successive manufacturing steps. Such steps are exemplary for providing the present invention.

Figure 3:
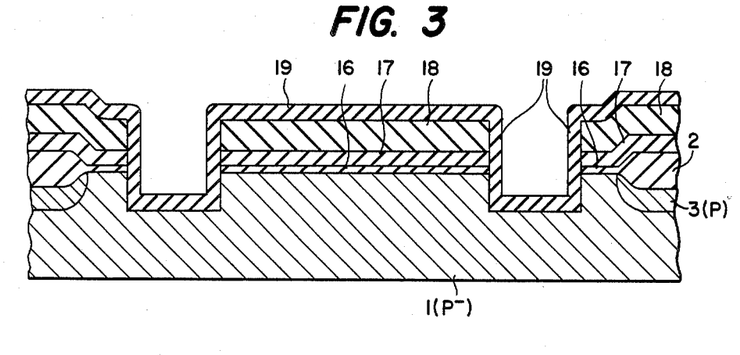
FIGS. 3 to 10 are views used to explain various steps carried out when manufacturing the memory cell of the DRAM shown in FIG. 1, which are sectional views of the memory cell in successive manufacturing steps.

Referring first to FIG. 3, a field insulating film (SiO₂ film) 2 and a p type channel stopper 3 are formed in a semiconductor substrate 1 of a silicon single crystal by a known method. More specifically, the field insulating film 2 is formed by selective thermal oxidation of the substrate 1 using a silicon nitride film as a mask. The channel stopper 3 is formed in such a manner that the boron introduced into the substrate 1 by ion implantation using the silicon nitride film as a mask is diffused in a drive-in manner during the previously mentioned selective thermal oxidation step. Thus, the field insulating film and channel stopper are formed as done conventionally, and have conventional dimensions. For example, as illustrative (and not limiting), the field oxide film, extending both above and below the main surface of the semiconductor substrate, has a total thickness of 700 nm, and extends 420 nm below the main surface of the semiconductor substrate. Moreover, and illustrative but not limiting, the channel stopper region 3 extends a further 400 nm below the bottom surface of the field oxide film. Compare with the depth of the shallow moat (again, illustrative and not limiting), of, e.g., 300 nm below the substrate surface.

Thereafter, a silicon oxide film 16 of 500 Å thickness is formed on the whole surface of the substrate 1 by thermal oxidation of the substrate 1, and a silicon nitride film 17 of 1,400 Å thickness is formed on the film 16 by chemical vapor deposition (CVD) or plasma CVD, and, further, a silicon oxide film 18 of 1 µm thickness is formed on the film 17 by CVD or plasma CVD. Then, the insulating films 18, 17 and 16 are selectively etched by conventional techniques to form a mask for forming a moat. Next, the semiconductor substrate 1 is etched to a depth of about 0.3 µm from the surface by, e.g., an anisotropic dry etching using an etching gas of mainly $CF_4$, thereby forming a relatively shallow moat (no reference number is given). In this etching, the film 17 is not etched by virtue of the presence of the film 18. This etching makes good use of the difference between the etching rate of silicon and that of silicon oxide. The depth of the shallow moat is set so that a semiconductor region 11 formed later is not deeper than the channel stopper region 3. In this way, it is possible to raise the level of voltage at which memory cells which are adjacent to each other conduct to each other, and the leakage current can thereby be minimized. Then, a silicon nitride film 19 of 1,400 Å thickness is formed on the whole surface of the substrate 1 by CVD or plasma CVD. This silicon nitride film 19 is also deposited on the side walls of the shallow moat.

Figure 4:
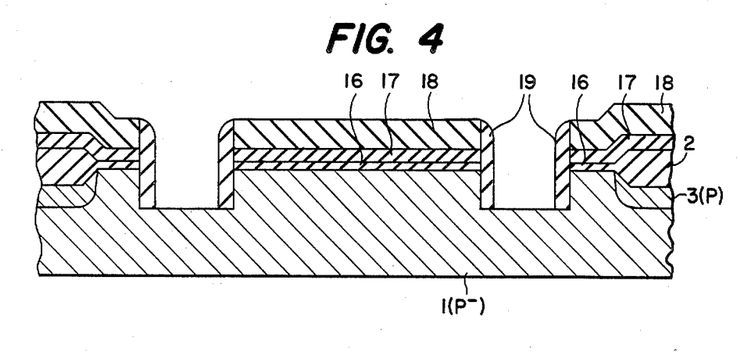

Then, as shown in FIG. 4, the silicon nitride film 19 is etched such that the side walls of the shallow moat are covered with a mask which prevents an insulating film 7 from being formed on the wall surface of the upper end portion of the moat. The silicon nitride film 19 is etched by anisotropic etching (e.g., reactive ion etching) using $CF_4$ (dry etching) so that the bottom of the moat is exposed. Thus, a mask can be formed on the side walls of the shallow moat.

Figure 5:
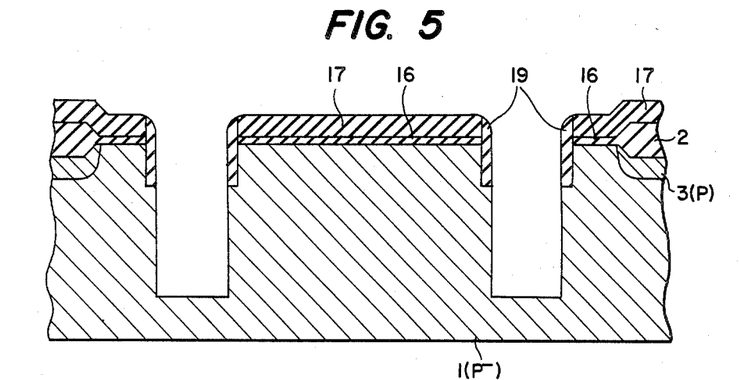

Then, as shown in FIG. 5, the bottom of the shallow moat is etched in the depthwise direction of the substrate 1 by an anisotropic etching using $CF_4$ gas (dry etching), thereby forming a relatively deep moat (no reference numeral is given). The depth of this deep moat from the surface of the substrate 1 is set at about 3 to 5 µm. The deep moat will be referred to simply as the "moat" in the following description of the manufacturing steps.

Figure 6:
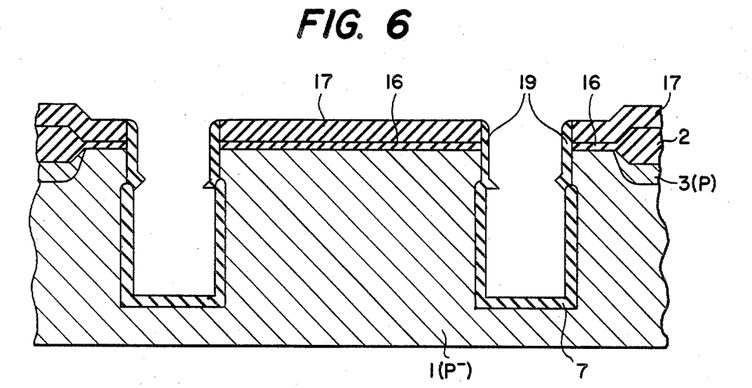

Then, the silicon oxide film 18 remaining on the substrate 1 is removed. Thereafter, as shown in FIG. 6, the exposed surface of the moat is oxidized by thermal oxidation, thereby forming an insulating film 7 constituted by a silicon oxide film of 1,000 Å thickness. No insulating film 7 is formed on the wall surface of the upper end portion of the moat, since the mask (that is the remaining portion of silicon nitride 19) is provided thereon. The main surface of the substrate 1 is not oxidized, since the silicon nitride film 17 is provided thereon. The silicon oxide film 16 prevents the production of any defect in the substrate 1 due to the difference in thermal expansion coefficient between the substrate 1 and the silicon nitride film 17 during the thermal oxidation. Thus, it is possible to avoid any deterioration of the characteristics of the MISFET in the memory cell. Then, the silicon nitride film 17 and the mask formed from silicon nitride film 19 are etched by using an etching liquid such as hot phosphoric acid.

Figure 7:
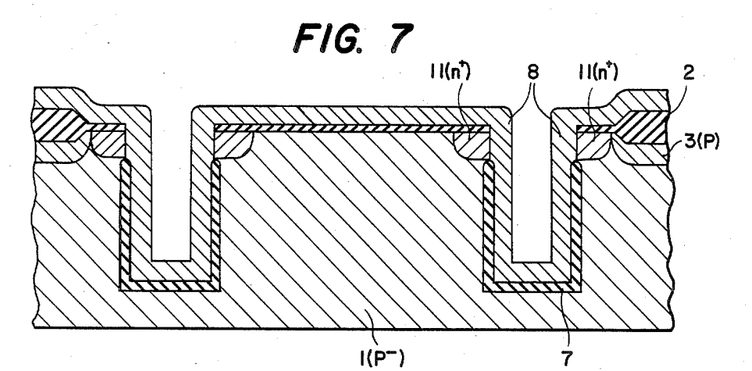
Figure 13:
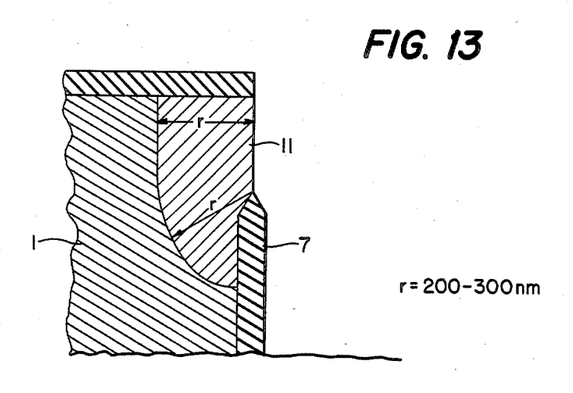
FIG. 13 is a sectional view for showing impurity diffusion to form region 11.

Then, as shown in FIG. 7, a polycrystalline silicon layer 8 of about 2,500 Å is formed on the whole surface, i.e., the surface of the insulating film 7, the surface of the substrate 1 exposed at the upper end of the moat, and so forth. Such polycrystalline silicon can be formed, e.g., by conventional CVD techniques. Then, an n-impurity such as phosphorus is introduced into the conductive layer 8 by, e.g., thermal diffusion. In consequence, the phosphorus is introduced into the substrate 1 through the junction between the layer 8 and the substrate 1 to form an n+ type semiconductor region 11. Although not limiting, such thermal diffusion can be performed at 1000° C. for 20 min., so as to provide an impurity concentration of the region 11 of $1 \times 10^{20}/cm^3$, for example. The phosphorus is diffused 0.3 to 0.5 µm in thickness horizontally in the substrate 1. As can be appreciated, the impurities for region 11 also diffuse in the vertical direction in substrate 1 to some extent. For example, as can be seen in FIG. 13, the region 11 is formed to extend downwards with a radius r, from the uppermost point of insulating film 7, a distance about the same as the horizontal thickness of the region 11.

The impurity for forming region 11 is not introduced directly into the substrate (apart from being introduced through layer 8) because of the silicon dioxide films 2 and 16, interposed between the impurity and the main surface of the substrate. In this regard, the diffusion velocity of phosphorus in the silicon dioxide film is very small as compared to the diffusion velocity of phosphorus in silicon. Similarly, the phosphorus is not introduced into the deep trench through insulating film 7.

Figure 8:
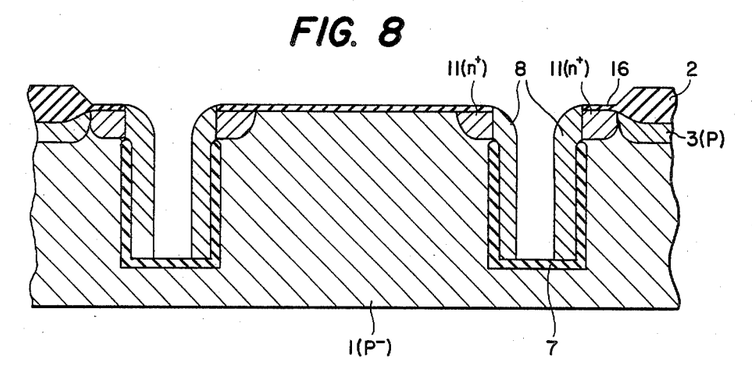

Then, the polycrystalline silicon layer 8 is etched by an anisotropic etching (reactive ion etching) technique using mainly $CF_4$ gas as the etching gas, which etching technique is known in the art, so that the silicon oxide film 16 is exposed, thereby forming an electrically conductive layer 8 as shown in FIG. 8. The provision of the region 11 enables the electrical connection between the semiconductor region 6 and the conductive layer 8 to be reliably and readily effected. In other words, by virtue of the presence of the region 11, the end portion of the conductive layer 10 which serves as a mask for forming the n+ type semiconductor region 6 can be aligned with the conductive layer 8 without requiring a very high degree of accuracy.

Figure 9:
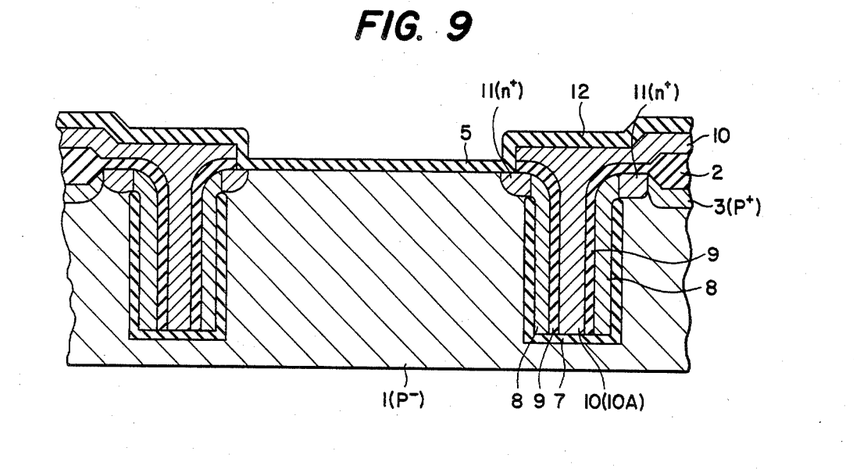

Then, as shown in FIG. 9, the surface of the conductive layer 8 is subjected to thermal oxidation to form a silicon oxide film (200 Å thickness) which serves as a dielectric film 9 of the capacitor element. Alternatively, the dielectric film 9 may be formed using a silicon oxide film or a laminate of a silicon oxide film, a silicon nitride film and a silicon oxide film, obtained by CVD. In order to form a buried electrode 10A and an electrically conductive layer 10 in the upper part of the moat, a polycrystalline silicon film of about 3,000 Å is then formed on the whole surface of the substrate 1 by CVD. The thickness of the polycrystalline silicon film on the flat portion of the substrate 1 is increased so that the surface of the polycrystalline silicon film above the moat (at the portion corresponding to the electrode 10A) is substantially flush with the surface of the flat portion. The polycrystalline silicon film is etched to form the other electrode of the capacitor. By this etching, the insulating film 16 which is not covered with the electrode 10 is removed. Then, the electrode 10 is subjected to thermal oxidation (e.g., at 800° C.) to form a silicon oxide film of 240 nm thickness on the electrode 10. By this thermal oxidation, a silicon oxide film of 40 nm thickness is formed on the substrate 1. Then, the film of 40 nm is removed to expose the surface of substrate 1. Next, thermal oxidation is performed again to make the silicon oxide film 5 of 25 nm, which silicon oxide film 5 is employed as a gate insulating film of the MISFET formed on the surface of the substrate 1. This technique also forms silicon oxide film 12 of 2000 Å thickness, which film 12 is employed as an insulating film between the electrode 10 and a word line (WL) 4.

Figure 10:
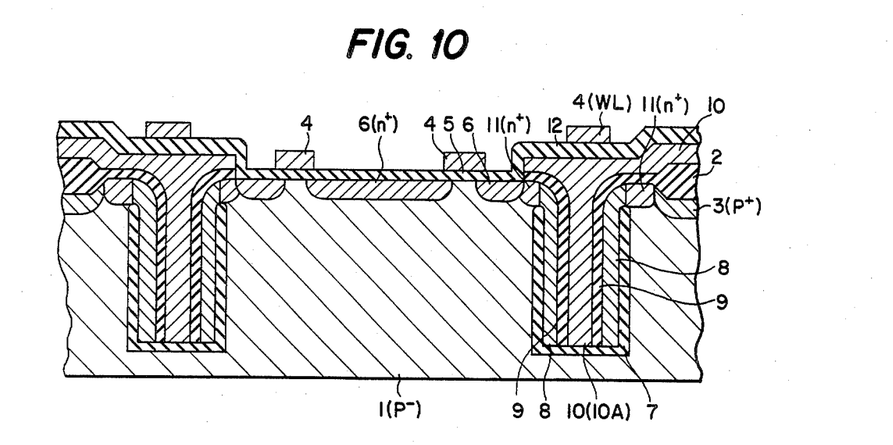

Then, a polycrystalline silicon film and a tungsten silicide film are successively formed on the whole surface of the substrate 1 by CVD and sputtering, respectively. Thereafter, these films are etched into a predetermined pattern by conventional techniques, thereby forming word lines WL and gate electrodes 4. It is to be noted that, in FIG. 10 (and FIG. 2), the gate electrodes 4 and the word lines WL are shown in such a manner that they are constituted by a single-layer film. Then, as shown in FIG. 10, with the gate electrode 4 and the electrode 10 employed as a mask, an n-impurity such as phosphorus (P) or arsenic (As) is introduced into the substrate 1 by, e.g., ion implantation in order to form semiconductor region 6. The introduced impurity is then diffused by annealing to form an n+ semiconductor region 6. The annealing is effected to diffuse the impurity so that the semiconductor regions 6 and 11 can be electrically connected together. As an example, to form region 6, the arsenic is ion implanted at $5 \times 10^{15}/cm^2$, at an energy of 80 KeV, and annealing is performed at 950° C. for 10 minutes.

Then, the interlayer insulating film 13 made of phosphosilicate glass, the contact hole 15 and the data line 14 made of aluminum, which have already been shown in FIGS. 1 and 2, together with a final passivation film, are successively formed to complete the DRAM in accordance with this embodiment.

As will be understood from the above description, according to the manufacturing method of this embodiment, the insulating film 7 is formed on the inner wall of the moat except for the side wall of the upper end portion thereof, the moat being formed by etching the semiconductor substrate 1 in the depthwise direction from the surface thereof, and the conductive layer 8 is deposited on the semiconductor substrate 1 exposed at the side wall of the upper end of the moat and the insulating film 7, and then an impurity is introduced into the substrate 1 from this conductive layer 8. Thus, it is possible to connect the conductive layer 8 and one of the semiconductor regions 6 of the MISFET at the side wall of the moat.

The novel technique disclosed in this application offers the following advantages:

(1) It has heretofore been necessary to provide a contact hole to the upper side, or to the surface, of one semiconductor region of a MISFET in order to connect this region and an electrically conductive layer which constitutes, e.g., an electrode of a capacitor element. In this embodiment, the conductive layer and the semiconductor region are connected at the upper end portion of a moat which extends in the depthwise direction from the surface of the semiconductor substrate. In consequence, it becomes unnecessary to ensure the area which would otherwise be occupied by the contact hole on the upper side of the semiconductor region, so that it is possible to reduce the area which the memory cell occupies on the substrate.

(2) When one end of the conductive layer of the capacitor element is connected to one semiconductor region of the MISFET through a contact hole provided on the upper surface of the semiconductor region, a mask alignment margin is required between the conductive layer and the gate electrode. In the present embodiment of this invention, however, the mask alignment margin is not necessary, since the conductive layer of the capacitor element is connected to the semiconductor region at the side wall of the upper end of the moat. It is therefore possible to further reduce the area which is occupied by the memory cell.

(3) The degree of integration of the DRAM can be increased by virtue of the advantageous effects mentioned in (1) and (2).

(4) When a moat and a capacitor electrode are provided around a MISFET, an inversion layer may be formed around the capacitor element, and an electric charge which represents information may flow out to a data line through the inversion layer. In this embodiment, the capacitor electrode is provided so as not to intersect the gate electrode (that is, the moat does not surround the MISFET). In consequence, when the MISFET is in a non-conductive state, the capacitor element and the data line are electrically isolated from each other. It is therefore possible to prevent the electric charge representing information from flowing out to the data line, so that the information holding time can be increased.

(5) Since it becomes unnecessary, by virtue of (4), to increase the impurity concentration in the semiconductor substrate in order to prevent the electric charge from flowing out through the inversion layer, it is possible to reduce the impurity concentration in the substrate and consequently minimize the parasitic capacitance of the semiconductor region. Thus, it is possible to increase the speed of operation in writing and reading information into and from the DRAM.

(6) An insulating film is formed on the inner wall of the moat except for the side wall of the upper end portion thereof, and an impurity is introduced into the semiconductor substrate from an electrically conductive layer deposited on a portion of the substrate exposed at the side wall of the upper end of the moat. Thus, it is possible to connect the conductive layer and one of the semiconductor regions of the MISFET in self alignment with each other at the side wall of the moat.

Although the invention accomplished by me has been described by way of a practical embodiment, it is a matter of course that the present invention is not necessarily limited to the described embodiment, and various changes and modifications may be imparted thereto without departing from the gist of the invention.

Figure 11:
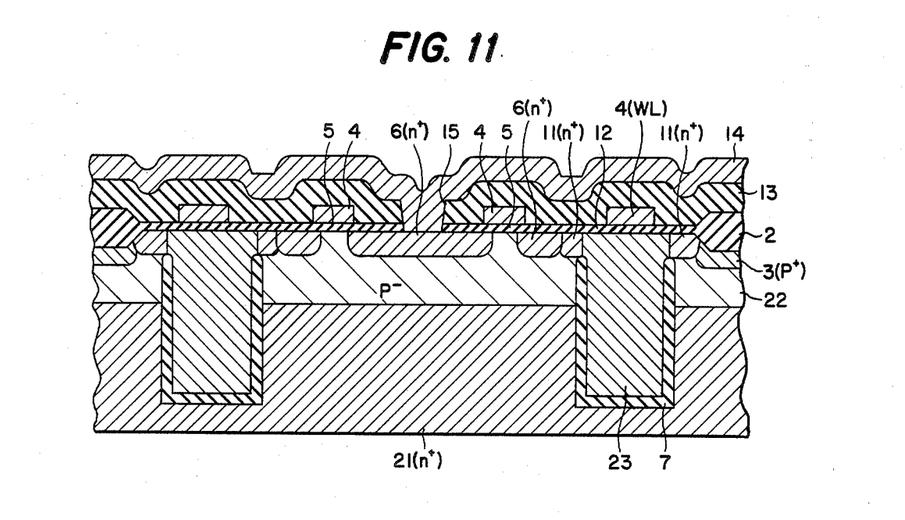
FIGS. 11 and 12 are sectional views respectively showing other embodiment of the present invention.

For example, as shown in FIG. 11, the moat may be filled up with an electrode 23 which performs the same function as that of the electrode 8, without providing the electrode 10. The surface of the electrode 23 is flattened so that it defines a flat surface which is continuous and flush with the surface of the substrate 1. By virtue of this arrangement, no step is present below the word line WL, which step would otherwise be produced by the presence of the electrode 10. It is therefore possible to reduce the resistance of the word line (WL) and prevent disconnection thereof. The electrode 23 is independently formed for each memory cell and buried in the moat. Two electrodes of the capacitor element are respectively constituted by a polycrystalline silicon layer 23 and a substrate 21, and the dielectric film is constituted by the insulating film 7. The thickness of this insulating film 7 is made relatively small, i.e., about 200 Å. The substrate 21 is of the n+ type, and a fixed potential, e.g., a potential of ½ $V_{CC}$, is applied to the substrate 21. A negative back bias voltage $V_{BB}$ (about −3.0 V) is applied to a p− type epitaxial layer 22 in which the MISFET is provided. Since the substrate 21 is employed as one of the electrodes of the capacitor element, no electrode needs to be provided on the substrate, so that the degree of integration is increased, and it is possible to apply any fixed potential to the capacitor element, the potential being different from that applied to the p− type layer 22. The thickness of the p− type layer 22 is preferably determined in consideration of the punch-through voltage between the n+ type regions 11 (or 6) and 21.

The electrode 23 may be formed as follows. After the steps shown in FIGS. 3 to 8 have been carried out, a relatively thick polycrystalline silicon film is deposited on the whole surface of the substrate again by CVD without forming the insulating film 9. Alternatively, in the step shown in FIG. 7, the polycrystalline silicon film 8 is deposited in such a manner that it has a relatively large thickness. The film thickness (several μm) is set so that the polycrystalline silicon film has a flat surface. Thereafter, an isotropic or anisotropic dry etching is effected to obtain a configuration such as that shown in FIG. 11. As an example, where the moat has a width of 1000 nm, a polycrystalline silicon film of 600 nm is deposited on the whole surface of the substrate 1 to make electrode 23.

The substrate 21 may be of the p+ type. In addition, the whole of the substrate 21 may be of the p− type without providing the epitaxial layer 22. In these cases, the fixed potential applied to the capacitor element is made equal to either the ground potential $V_{SS}$ (0 V) or the back bias potential $V_{BB}$ (−3.0 V). The thickness of the insulating layer 7 is slightly increased (e.g., 500 Å) in these cases.

Figure 12:
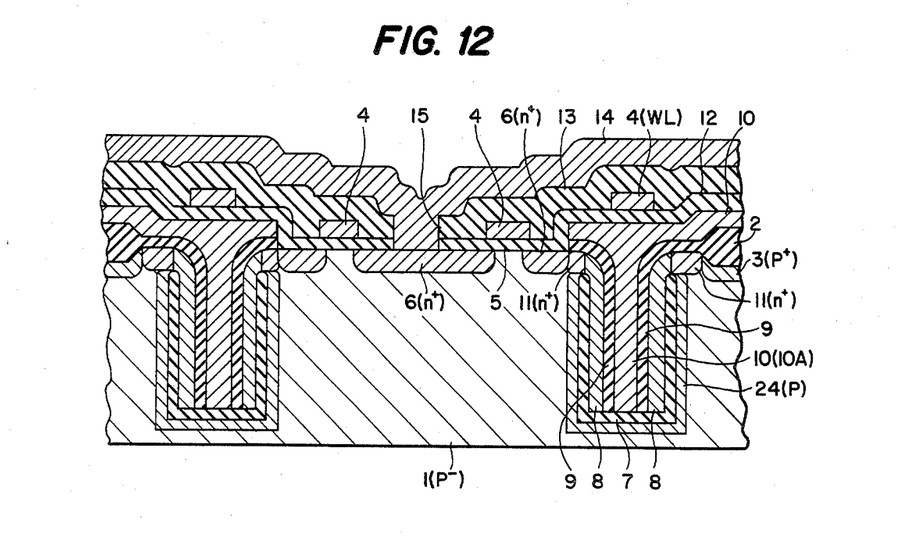

As shown in FIG. 12, a p type semiconductor region 24 may be provided on the surface of the moat. In this case, the capacitor element is constituted by a first capacitor element composed of the electrodes 24 and 8 and the insulating film 7 and a second capacitor element composed of the electrodes 8 and 10 and the insulating film 9, which are stacked on the former. The second capacitor element may be omitted, and the electrode 23 may be provided in such a manner as that shown in FIG. 11 in place of the electrodes 8 and 10.

The region 24 may be formed as follows. After the steps shown in FIGS. 3 to 5 have been carried out, boron is introduced into the substrate by diffusion using the silicon nitride films 17 and 19 as a mask. The concentration of boron is determined in consideration of the reverse breakdown voltage at the pn junction between the regions 11 and 24 (e.g., $1 \times 10^{18}/cm^3$).

The present invention is effectively applied to general semiconductor memories having a capacitor element utilizing a moat or trench and, more particularly, to a semiconductor memory having a capacitor element which is connected at one electrode thereof to a semiconductor region in the semiconductor substrate. More generally, the present invention can be applied to semiconductor devices so as to provide electrical connection between semiconductor elements formed in a moat or trench and semiconductor elements formed on or in a semiconductor substrate.

While I have shown and described several embodiments in accordance with the present invention, it is understood that the same is not limited thereto but is susceptible of numerous changes and modifications as known to one having ordinary skill in the art and I therefore do not wish to be limited to the details shown and described herein, but intend to cover all such modifications as are encompassed by the scope of the appended claims.

What is claimed is:

1. A process for manufacturing a semiconductor integrated circuit device having a capacitor, with one electrode of the capacitor adapted to be electrically connected to a first semiconductor region formed in a semiconductor substrate, said process comprising the steps of:
   forming a first mask on the main surface of said semiconductor substrate;
   forming a relatively shallow moat in said semiconductor substrate by employing said first mask, said relatively shallow moat having a side wall and a bottom;
   forming a second mask on the side wall of said shallow moat, said second mask being formed of an oxidation impermeable film, the bottom of the relatively shallow moat being exposed through the second mask;
   forming a relatively deep moat, said deep moat being formed by etching the bottom of said shallow moat exposed through said first and second masks;
   forming an oxide film by thermal oxidation of the surface of said deep moat by employing said second mask;
   removing said second mask, thereby exposing the surface of said semiconductor substrate at the upper end of the side wall of said deep moat; and
   forming said one electrode in said deep moat, said one electrode being adapted to be electrically connected to said first semiconductor region through a portion of said substrate exposed by removing said second mask.

2. A process for manufacturing a semiconductor integrated circuit device according to claim 1, including the further step of forming an electrical connection region extending between said one electrode and the location of said first semiconductor region formed in said substrate, so as to electrically connect said one electrode and said first semiconductor region, said electrical connection region extending to said portion of said substrate exposed by removing said second mask.

3. A process for manufacturing a semiconductor integrated circuit device according to claim 2, wherein the step of forming an electrical connection region includes, after forming the one electrode, introducing impurities into said one electrode and diffusing impurities from said one electrode into said semiconductor substrate, through the portion of said substrate exposed by removing the second mask.

4. A process for manufacturing a semiconductor integrated circuit device according to claim 2, wherein, after the further step of forming the electrical connection region, the first semiconductor region is formed in contact with the electrical connection region, the first semiconductor region being formed by introducing impurities, of the same conductivity type as that diffused from the one electrode, into the surface of the semiconductor substrate.

5. A process for manufacturing a semiconductor integrated circuit device according to claim 4, wherein, before forming the first semiconductor region and after forming the electrical connection region, an insulating layer as a dielectric film for said capacitor and a second electrode for said capacitor are formed in said moat, and said first semiconductor region is formed using said second electrode as a mask.

6. A process for manufacturing a semiconductor integrated circuit device according to claim 1, wherein said first mask includes an oxidation impermeable film.

7. A process for manufacturing a semiconductor integrated circuit device according to claim 1, wherein said second mask is constituted by silicon nitride and formed by reactive ion etching a silicon nitride film formed on the semiconductor substrate, including on surfaces of the relatively shallow moat.

8. A process for manufacturing a semiconductor integrated circuit device according to claim 1, further comprising the steps of:
    forming an electrical connection region extending between said one electrode and the location of the first semiconductor region formed in the substrate;
    removing said first mask; and
    forming a MISFET in said semiconductor substrate, said MISFET including said first semiconductor region as a source or drain region thereof,
    whereby a memory cell constituted by a series circuit of said MISFET and said capacitor can be formed.

9. A process for manufacturing a semiconductor integrated circuit device according to claim 8, wherein said relatively shallow moat is formed adjacent to and so as not to surround the location at which said MISFET is formed.

10. A process for manufacturing a semiconductor integrated circuit device according to claim 8, wherein said one electrode is made of polycrystalline silicon, and further including the step of forming an electrical connection region in the semiconductor substrate for connecting the one electrode and the first semiconductor region, the electrical connection region being formed by diffusion of an impurity into said semiconductor substrate from said polycrystalline silicon.

11. A process for manufacturing a semiconductor integrated circuit device according to claim 10, wherein said impurity is diffused into said semiconductor substrate from said polycrystalline silicon film through said portion of said substrate exposed by removing said second mask.

12. A process for manufacturing a semiconductor integrated circuit device according to claim 8, further comprising the step of forming, prior to the formation of said first mask, a field insulating film by selective thermal oxidation of said main surface of said semiconductor substrate, said field insulating film defining a region for forming said memory cell, and said deep moat is in the shape of a column and is formed in the main surface of said semiconductor substrate.

13. A process for manufacturing a semiconductor integrated circuit device according to claim 8, further comprising the step of forming a second semiconductor region in said semiconductor substrate extending from the surface of the semiconductor substrate exposed in the deep moat, said second semiconductor region being of a conductivity type different from that of said first semiconductor region, said second semiconductor region being formed by introducing an impurity into said semiconductor substrate exposed in said deep moat by employing said first and second masks before the formation of said oxide film, and said second semiconductor region being employed as the other electrode of said capacitor.

14. A process for manufacturing a semiconductor integrated circuit device according to claim 13, further comprising the steps of forming an insulating film on an exposed surface of the one electrode so as to form a dielectric film for a second capacitor, and forming a further conductive layer so as to act as a second electrode of said second capacitor, whereby two capacitors can be formed using a single deep moat.

15. A process for manufacturing a semiconductor integrated circuit device according to claim 8, wherein said one electrode is formed by forming a layer of conductive material on the oxide film, on said portion of the substrate exposed by removing said second mask, and on the main surface of the semiconductor substrate; and by removing that portion of the layer of conductive material on the main surface of the semiconductor substrate by reactive ion etching so as to form the one electrode on the side wall of said deep moat.

16. A process for manufacturing a semiconductor integrated circuit device according to claim 15, wherein an insulating film, forming the dielectric film of said capacitor, is formed on an exposed surface of said one electrode, and the other electrode of said capacitor is formed so as to fill the remainder of the relatively deep moat.

17. A process for manufacturing a semiconductor integrated circuit device according to claim 16, wherein said other electrode is formed integrally with a conductive layer formed on the main surface of the semiconductor substrate.

18. A process for manufacturing a semiconductor integrated circuit device according to claim 8, wherein said one electrode is formed in such a manner that said deep moat is filled up with said electrode, and the surface of said electrode is substantially flush with said main surface of said semiconductor substrate, the other electrode of said capacitor being formed inside said semiconductor substrate.

19. A process for manufacturing a semiconductor integrated circuit device according to claim 8, wherein said semiconductor substrate is composed of a relatively high-impurity concentration region having a conductivity type equal to that of said first semiconductor region, and a relatively low-impurity concentration region formed on said high-impurity concentration region and having a conductivity type opposite to that of said first semiconductor region, said deep moat being formed so as to reach said high-impurity concentration region, said first semiconductor region and the source or drain region of said MISFET being formed within said low-impurity concentration region, and said high-impurity concentration region being employed as the other electrode of said capacitor.

20. A process for manufacturing a semiconductor integrated circuit device according to claim 1, wherein said one electrode is made of polycrystalline silicon, and wherein the process includes the further step of forming an electrical connection region in the semiconductor substrate for connecting the one electrode and the first semiconductor region, the electrical connection region being formed by diffusion of an impurity into said semiconductor substrate from said polycrystalline silicon.

21. A process for manufacturing a semiconductor integrated circuit device having a semiconductor element in a trench formed in a semiconductor substrate, with an electrically conducting member of the semiconductor element being adapted to be electrically connected to a semiconductor region formed in the semiconductor substrate, comprising the steps of:

forming a relatively shallow moat in said semiconductor substrate, said relatively shallow moat having a side wall and a bottom;

forming a mask on the side wall of said relatively shallow most, said mask being formed on an oxidation impermeable film, the bottom of the relatively shallow moat being exposed through the mask;

forming a relatively deep moat, said deep moat being formed by etching the bottom of said relatively shallow moat;

forming an oxide film by thermal oxidation of the surface of said semiconductor substrate exposed in said deep moat by employing said mask;

removing said mask, thereby exposing the surface of said semiconductor substrate at the upper end of the side wall of said deep moat; and forming said electrically conducting member in said deep moat, said electrically conducting member being adapted to be electrically connected to said semiconductor region through the surface of the semiconductor exposed by removing said mask.

22. A process for manufacturing a semiconductor integrated circuit device according to claim 21, wherein said electrically conducting member includes impurities introduced therein, and the process comprises the further steps, after forming said electrically conducting member, of:

forming an electrical connection region by diffusing impurities from the electrically conducting member into the semiconductor substrate, through the surface of the semiconductor substrate exposed by removing the mask; and forming the semiconductor region in contact with the electrical connection region, by introducing impurities, of the same conductivity type as that introduced into the electrically conducting member, into the semiconductor substrate.

* * * * *